United States Patent
Härkönen et al.

(10) Patent No.: US 7,198,820 B2
(45) Date of Patent: Apr. 3, 2007

(54) DEPOSITION OF CARBON- AND TRANSITION METAL-CONTAINING THIN FILMS

(75) Inventors: Kari Härkönen, Kauniainen (FI); Mark Doczy, Beaverton, OR (US); Teemu Lang, Helsinki (FI); Nathan E. Baxter, Portland, OR (US)

(73) Assignee: Planar Systems, Inc., Beaverton, OR (US)

( * ) Notice: Subject to any disclaimer, the term of this patent is extended or adjusted under 35 U.S.C. 154(b) by 0 days.

(21) Appl. No.: 10/642,426

(22) Filed: Aug. 15, 2003

(65) Prior Publication Data
US 2004/0208994 A1 Oct. 21, 2004

Related U.S. Application Data

(60) Provisional application No. 60/445,571, filed on Feb. 6, 2003.

(51) Int. Cl.
C23C 16/32 (2006.01)

(52) U.S. Cl. .......................... 427/249.17; 427/249.18; 427/249.19

(58) Field of Classification Search ............. 427/249.1, 427/249.17, 249.18, 249.19
See application file for complete search history.

(56) References Cited

U.S. PATENT DOCUMENTS

| | | | | |
|---|---|---|---|---|
| 4,378,987 A * | 4/1983 | Miller et al. | ................... | 65/418 |
| 4,422,888 A * | 12/1983 | Stutius | ........................ | 117/93 |
| 5,933,760 A * | 8/1999 | Iyer et al. | .................... | 438/778 |
| 6,174,809 B1 | 1/2001 | Kang et al. | | |
| 6,482,262 B1 * | 11/2002 | Elers et al. | .................... | 117/84 |
| 6,599,572 B2 * | 7/2003 | Saanila et al. | ......... | 427/249.18 |
| 6,616,986 B2 * | 9/2003 | Sherman | ..................... | 427/562 |
| 6,699,524 B2 * | 3/2004 | Kesala | .................... | 427/248.1 |
| 6,730,164 B2 * | 5/2004 | Vaartstra et al. | ............ | 117/104 |
| 6,800,552 B2 * | 10/2004 | Elers et al. | ................. | 438/680 |
| 6,951,813 B2 | 10/2005 | Derderian | | |
| 6,986,914 B2 * | 1/2006 | Elers et al. | ............ | 427/255.23 |
| 2002/0086504 A1 | 7/2002 | Park et al. | | |
| 2003/0022457 A1 | 1/2003 | Gutsche et al. | | |
| 2003/0031807 A1 | 2/2003 | Elers et al. | | |
| 2005/0037557 A1 | 2/2005 | Doczy et al. | ............... | 438/197 |

FOREIGN PATENT DOCUMENTS

WO     WO 01/29280 A1     4/2001

OTHER PUBLICATIONS

Marika Juppo, "Atomic Layer Deposition of Metal and Transition Metal Nitride Thin Films and In Situ Mass Spectrometry Studies," Univ. of Helsinki, Faculty of Science, Dept. of Chemistry, Laboratory of Inorganic Chemistry, Academic Dissertation, Dec. 14, 2001, 65 pages, Helsinki, Finland.

(Continued)

Primary Examiner—Bret Chen
(74) Attorney, Agent, or Firm—Buchanan, Ingersoll & Rooney PC

(57) ABSTRACT

A process depositing a carbon- and transition metal-containing thin film on a substrate involves placing a substrate within a reaction space and sequentially pulsing into the reaction space a transition metal chemical and an organometallic chemical. Following each chemical pulse, the reaction space is purged, and the pulse and purge sequence is repeated until a desired film thickness is obtained. A preferred deposition process uses atomic layer deposition techniques and may result in an electrically conductive thin carbide film having uniform thickness over a large substrate area and excellent adhesion and step coverage properties.

60 Claims, 4 Drawing Sheets

OTHER PUBLICATIONS

Peter Ettmayer & Walter Lengauer, "Nitrides: Transition Metal Solid State Chemistry," Encyclopedia of Inorganic Chemistry, 1994 (R. Bruce King, ed.), pp. 2498-2515, vol. 5, John Wiley & Sons, West Sussex, England.

Peter Ettmayer & Walter Lengauer, "Carbides: Transition Metal Solid State Chemistry," Encyclopedia of Inorganic Chemistry, 1994 (R. Bruce King, ed.), pp. 519-531, vol. 5, John Wiley & Sons, West Sussex. England.

T. Suntola and M. Simpson, "Atomic Layer Epitaxy," 1990, pp. 18-21 and 38-39, Blackie and Son Ltd., Glasgow and London, England.

Toivo T. Kodas and Mark J. Hampden-Smith eds., The Chemistry of Metal CVD, 1994, pp. 60-63 and title pages, VCH, Weinheim, Germany.

* cited by examiner

DEPOSITION OF CARBON- AND TRANSITION METAL-CONTAINING THIN FILMS

RELATED APPLICATION

This application claims the benefit under 35 U.S.C. § 119(e) of U.S. Provisional Patent Application No. 60/445,571, filed Feb. 6, 2003, which is incorporated herein by reference.

COPYRIGHT NOTICE

© 2002 Planar Systems, Inc. A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever. 37 CFR § 1.71(d).

TECHNICAL FIELD

The present invention relates to a process for depositing a thin film including carbon and a transition metal, to films formed by such deposition processes, to structures made with such films, and to devices for forming such films and structures.

BACKGROUND OF THE INVENTION

Transition metal carbides are generally known to show a unique combination of solid-state properties including exceptional mechanical hardness, excellent electrical and thermal conductivity, and very high melting points in addition to being chemically inert and wear resistant (see *Encyclopedia of Inorganic Chemistry*, Volume 1, pp. 519–531, 1994). Use of transition metal carbides has been suggested for several different types of film application, including wear-resistant coatings, hard coatings, and diffusion barrier films.

Atomic Layer Deposition (ALD), or, as it is often called, Atomic Layer Epitaxy (ALE), is a method of manufacturing thin films that was first investigated in the 1970s. ALD refers to a process of depositing a thin film onto a substrate that involves sequential and alternating self-saturating surface reactions. As compared to other thin film deposition methods, such as Physical Vapor Deposition (PVD) (e.g., evaporation or sputtering), Chemical Vapor Deposition (CVD), or Metal Organic CVD (MOCVD), ALD offers several benefits. These benefits and the principles of ALD are well known to those skilled in the art (*Atomic Layer Epitaxy*, Suntola, T. and Simpson, M., eds., Blackie and Son Ltd., Glasgow, 1990). Although ALD has been used in connection with many materials, it has not been successfully used for transition metal carbides.

One attempt to process films with transition metal nitrides using ALD is described by Leskelä and Niinistö in *Atomic Layer Epitaxy*. Id. at 18–21. Leskelä and Niinistö prepared niobium nitride (NbN) films for niobium-based superconductors using metal chlorides and ammonia. As stated on page 19, "[t]he interest in niobium nitride films stems from its superconductivity below 17K." Because "the properties of nitrides can be in some cases improved by the addition of carbon," Leskelä and Niinistö also used ALD to add carbon to NbN films. Id. at page 20. Specifically, they used methane as the carbon source, postulating that the carbon would enhance the mechanical and superconductivity properties of the NbN films. "A black niobium carbide (NbC) film was formed but the growth rate was slow and the film was amorphous." Id. at 21.

Another attempt to process transition metal nitride films by ALD is described in Marika Juppo's academic dissertation entitled *Atomic Layer Deposition of Metal and Transition Metal Nitride Thin Films and In Situ Mass Spectrometry Studies* (Helsinki University, pp. 48–49, 2001). Juppo describes a method of depositing transition metal nitrides using titanium tetrachloride ($TiCl_4$), trimethylaluminum ($Al(CH_3)_3$), and ammonia ($NH_3$) that produces titanium aluminum nitride (Ti(Al)N) films having some carbon content. Persons of ordinary skill in the art know that a nitrogen-deficient transition metal carbide film (i.e., containing less than 10 atomic-% nitrogen) cannot be formed using this method or any similar method for growing nitrides.

U.S. Patent Application Publication No. 2002/0086504 of Park et al. describes a process of manufacturing a semiconductor device having a metal gate electrode formed by depositing a $(Ti_xAl_y)_{1-z}N_z$ film over a gate insulating film. The process implements CVD or ALD for depositing the $(Ti_xAl_y)_{1-z}N_z$ film and for controlling a work function of the film.

U.S. Pat. No. 6,482,262 (the "'262 patent") to Elers et al. describes an attempt to process transition metal carbide films by ALD. The '262 patent describes a method of depositing transition metal carbide thin films by ALD "in which a transition metal source compound and a carbon source compound are alternatively provided to the substrate." Abstract. The '262 patent describes the use of several carbon-containing compounds as the carbon source compound, including a boron compound comprising at least one boron atom and at least one carbon atom, a silicon compound comprising at least one silicon atom and at least one carbon atom, and a phosphorus compound comprising at least one phosphorus atom and at least one carbon atom. Due to the chosen carbon sources, the carbide films of the '262 patent are likely to contain trace amounts of boron, silicon, or phosphorus contamination. Because deposition occurs at high temperatures, the substrate surface layers may be affected by the contaminated carbide film or by boron-, silicon-, or phosphorus-containing carbon source compound in contact with the substrate, which can negatively affect the operability of devices made with the resulting films. The '262 patent also describes using a hydrocarbon as the carbon source, but states that this alternative carbon source is undesirable because its use involves activation of the reaction with a plasma, requiring a more complicated and expensive reactor design.

Another attempt to process metal films by ALD is described in U.S. Pat. No. 6,174,809 (the "'809 patent") to Kang et al. The '809 patent describes a method of forming metal layers using ALD in combination with a sacrificial metal layer first formed on a semiconductor substrate and subsequently reacted with a metal halide gas to form the desired metal layer. For example, a pure aluminum sacrificial metal layer is formed by the deposition of trimethylaluminum ($Al(CH_3)_3$) (hereinafter "TMA") reduced by hydrogen that is reacted with titanium tetrachloride ($TiCl_4$) to convert the aluminum sacrificial metal layer into a titanium metal layer. Any carbide formation is naturally suppressed by the use of a reducing hydrogen. Consequently, transition metal carbide films cannot be formed using this method for growing metals.

U.S. Publication No. 2003/0022457 A1 to Gutsche et al. describes a method of forming a metal carbide layer involving depositing an alternating sequences of metal-containing layers and carbon-containing layers. The resulting layered structure is then heated in a separate step in a separate tool (such as a rapid thermal process) to migrate the carbon-containing and metal-containing layers together and form a metal carbide layer. However, this high temperature treatment decreases the capacity of the process steps and requires the use of expensive and complex manufacturing equipment.

The present inventors have recognized a need for methods of depositing onto a substrate a transition metal carbide film exhibiting chemical inertness and electrical conductivity, as well as methods preferably offering the user the ability to tailor and fine-tune the deposition process and film properties while exhibiting good processibility and reasonable growth rate.

The present inventors have also recognized a need for transition metal carbide thin films that can be easily implemented in advanced semiconductor structures and that include minimal impurities that would interact with neighboring layers and thereby negatively affect operation of the semiconductor structure.

SUMMARY OF THE INVENTION

A process for depositing a carbon- and transition metal-containing thin film on a substrate (hereinafter "the deposition process") involves placing a substrate within a reaction space, and sequentially pulsing into the reaction space a transition metal chemical and an organometallic chemical (sometimes called a metalorganic chemical). Following each chemical pulse, the reaction space is purged to remove excess chemicals from the reaction space. This pulse and purge sequence is repeated until a desired film thickness is obtained. A preferred deposition process is performed using atomic layer deposition (ALD) techniques and may desirably result in an electrically conductive thin film having uniform thickness over a large substrate area and excellent adhesion and step coverage properties. Further, the resulting film preferably grows at a reasonable growth rate and is chemically inert.

Additional aspects and advantages will be apparent from the following detailed description of preferred embodiments, which proceeds with reference to the accompanying drawings.

DETAILED DESCRIPTION OF PREFERRED EMBODIMENTS

Figure 1:
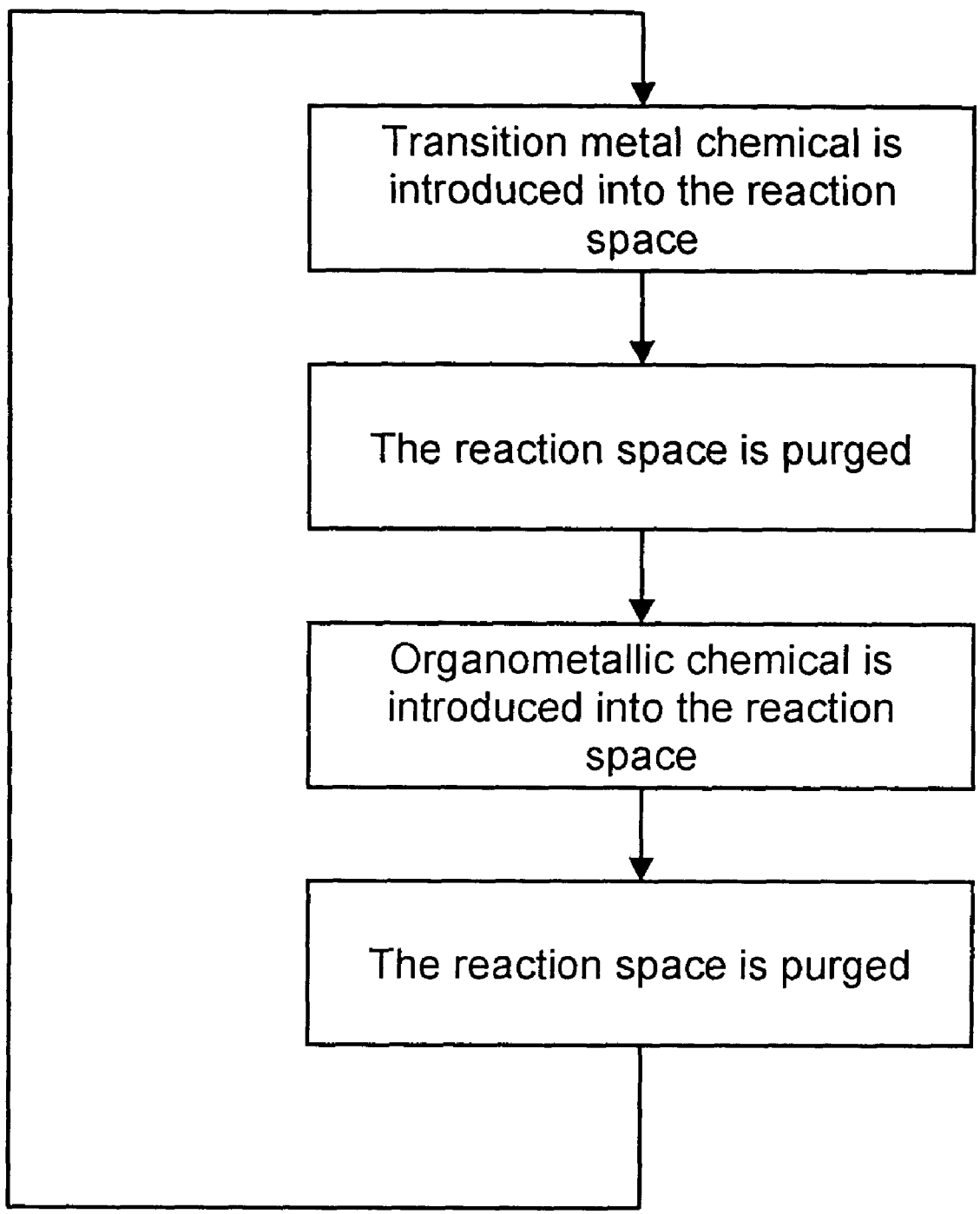
FIG. 1 is a flow chart of a cycle of a deposition process in accordance with a preferred embodiment of the present invention.

Throughout the specification, reference to "one embodiment," or "an embodiment," or "some embodiments" means that a particular described feature, structure, or characteristic is included in at least one embodiment. Thus appearances of the phrases "in one embodiment," "in an embodiment," or "in some embodiments" in various places throughout this specification are not necessarily all referring to the same embodiment. Furthermore, the described features, structures, or characteristics may be combined in any suitable manner in one or more embodiments. Those skilled in the art will recognize that the various embodiments can be practiced without one or more of the specific details or with other methods, components, materials, etc. In other instances, well-known structures, materials, or operations are not shown or not described in detail to avoid obscuring aspects of the embodiments.

Further, as used herein, the terms "carbon- and transition metal-containing thin film" and "CTM film" are used to refer to films having the presence of both transition metals and carbon, which may indicate the presence of transition metal carbides and/or carbide-like materials of the transition metals. In some instances, the films are referred to as "carbide." However, films produced by the processes described herein may include pure carbides, carbides mixed with other substances, and mixtures of transition metals and carbon, but with little or no carbides. Therefore, the use of the terms "carbon- and transition metal-containing thin films," "CTM films," "transition metal carbide," and "carbide of the transition metal" should not be construed as limited to pure carbide, but may also include, for example, mixtures of carbide and other materials, such as metals and/or oxides, and mixtures or compounds of carbon and metal, with little or no carbide.

A deposition process in accordance with a first preferred embodiment involves sequentially introducing into a reaction space including a substrate a transition metal chemical and an organometallic chemical. Performing the deposition process produces a carbon- and transition metal-containing thin film (hereinafter "the CTM film") on the surface of the substrate. A thin film produced using this process displays desirable electrical and chemical features such as electrical conductivity and dielectric properties despite the lack of a preplanned stoichiometric composition, which prior art methods of forming a CTM film typically required. Preferably, the deposition process is performed in accordance with the principles of ALD, so that the growth of the CTM film is self-limiting. However, other methods may be used.

Suitable ALD processes and ALD reactors are described in U.S. Pat. Nos. 4,389,973 and 4,413,022, which are incorporated herein by reference. Improved reactors and processes useful for depositing CTM films in accordance with the various processes described herein are disclosed in U.S. Provisional Patent Application No. 60/410,067, filed Sep. 11, 2002, which is also incorporated herein by reference. For example, an ALD reactor for performing the processes of the various embodiments preferably includes a reaction space in which is placed one or more substrates, a first source system for delivering to the reaction space an organometallic chemical, a second source system for delivering to the reaction space a transition metal chemical, an inert gas flow system, a heating system for heating the substrate(s) and the organometallic and transition metal chemicals, and a control system operatively coupled to the first and second source systems for controlling the delivery of the chemicals into the reaction space.

The deposition process and products of the preferred embodiments were developed while working with various nucleation promoters. Nucleation promoters, such as titanium tetrachloride ($TiCl_4$), titanium hydride ($TiH_2$), chromium trichloride ($CrCl_3$), vanadium tetrachloride ($VCl_4$) and niobium pentachloride ($NbCl_5$), have been used to optimize aluminum deposition in metal CVD (see, e.g., *The*

*Chemistry of Metal CVD*, Hampden-Smith, M. J. and Kodas, T. T. (eds.), VHC Verlagsgesellschaft mbH, Weinheim and VCH Publishers Inc., New York, pp. 60–61 (1994)). In a nucleation promoter experiment, $TiCl_4$ was used to optimize the nucleation of TMA. A nucleation cycle in which $TiCl_4$ and TMA were alternatingly deposited was repeated in the ALD reactor 1,500 times. The result was the growth of a uniform metallic and non-transparent film, most of which surprisingly consisted of titanium and carbon instead of aluminum. In the resulting film, only a low concentration of aluminum was present.

The physical and/or chemical mechanism leading to the growth of the CTM film is not completely understood at this time. One hypothesis is that before the substrate is exposed to the organometallic chemical or the transition metal chemical, the surface of the substrate favors neither metal nucleation nor decomposition, but rather controlled chemisorption. Such a propensity toward chemisorption may be a result of the transition metal chemical pulse reaction, which involves the exhaustion of halogen atoms due to the formation of vaporizing metal and halogen compounds. The resulting surface may have carbon and transition metal atoms bound to each other instead of the more typical catalyst-aided formation of a metal complex with halogen atoms on the surface. Alternatively, a surface-bound transition metal complex may form on the substrate surface.

A preferred deposition process involves placing a substrate into a reaction space, introducing an inert gas into the reaction space, heating the reaction space to the desired temperature, and adjusting the pressure of the reaction space to the desired temperature. The reaction space is preferably operated at a reduced pressure, preferably between about 0.1 mbar and about 50 mbars. Alternatively, the reaction space may be at atmospheric pressure. The deposition process is preferably performed at an elevated temperature, for example between about 150° C. and about 600° C., or, more preferably, between about 250° C. and about 550° C. It is expected that some embodiments of the deposition process may be performed at temperatures below about 150° C. and above about 600° C., although such operating temperatures may be less preferable. For example, low substrate temperatures at about 90° C. produce some films containing little or no aluminum. However, these films are not conductive. Lower temperatures are also believed to help avoid decomposition during the deposition of the organometallic chemical.

Next, a cycle for forming a single layer of the CTM film proceeds as follows, with reference to FIG. 1. An organometallic chemical is introduced into the reaction space. A portion of the organometallic chemical adsorbs onto at least one surface of the substrate and thereby forms an adsorbed layer on the substrate surface. The reaction space is then purged with an inert purging gas to remove most of the excess (not surface-bound) transition metal chemical and any adsorption by-products. Next, transition metal chemical is introduced into the reaction space. A portion of the transition metal chemical reacts with the adsorbed layer and forms a CTM film. The reaction space is purged again with an inert purging gas to remove the excess transition metal chemical and any reaction by-products. This sequence may be repeated n times, where n describes an integer number of cycles, until sufficient layers are formed to yield a CTM film having the desired thickness. Alternatively, a cycle may involve reversing the steps such that the transition metal chemical is introduced, followed by a first purge with a purging gas, and then the organometallic chemical is introduced, followed by a second purge with a purging gas.

Figure 2:
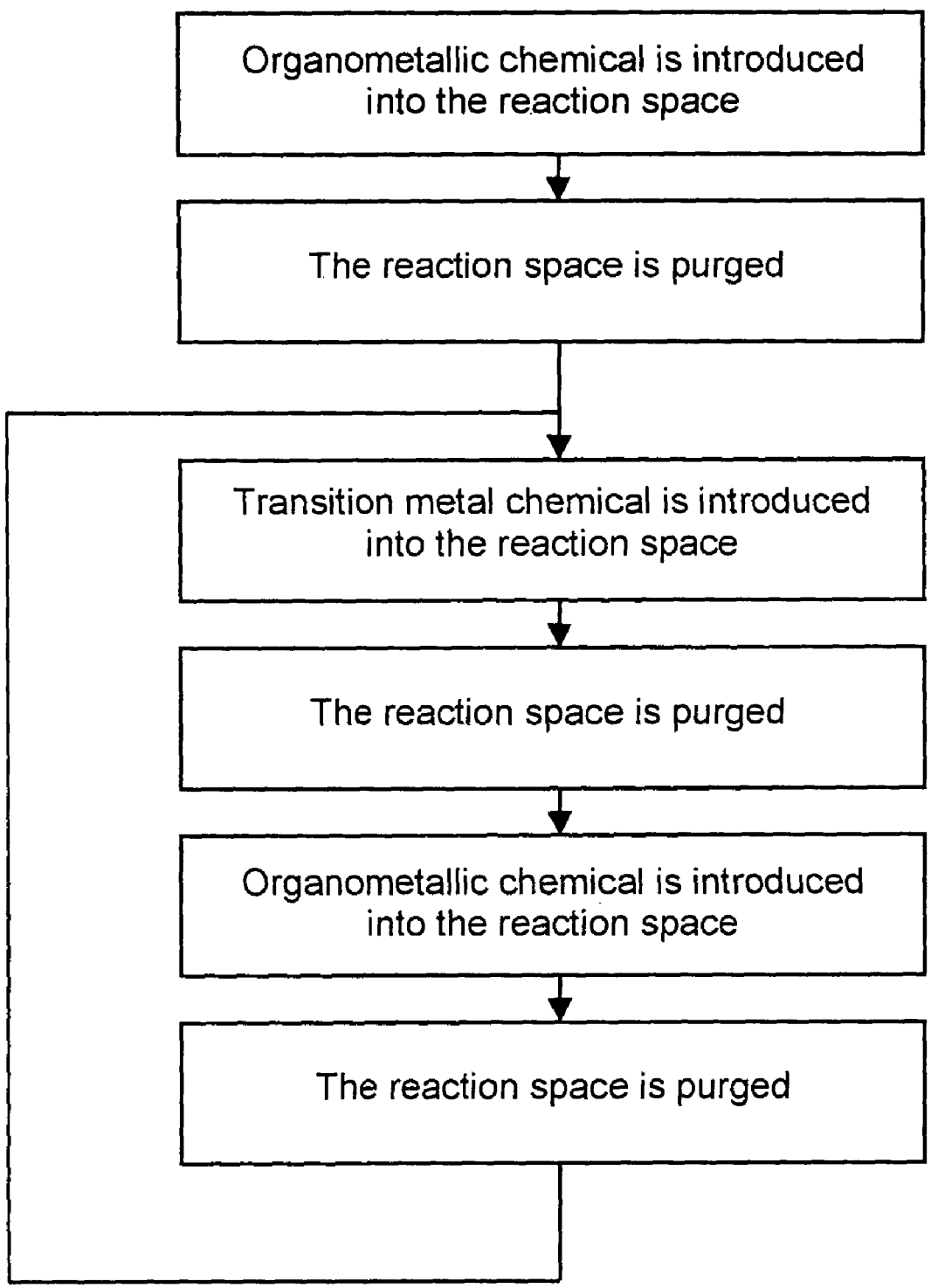
FIG. 2 is a flow chart of an alternative embodiment of the deposition process of the present invention having a "starting pulse".

FIG. 2 schematically represents an alternative deposition process, which includes a starting pulse. With reference to FIG. 2, a starting pulse comprises introducing an organometallic chemical into the reaction space, thereby forming an adsorbed layer on the substrate surface. The reaction space is then purged with an inert purging gas to remove the excess organometallic chemical and any adsorption by-products. Following the starting pulse, a cycle comprising introducing a transition metal chemical into the reaction space, purging the reaction space with an inert gas, introducing an organometallic chemical into the reaction space, and purging the reaction space with an inert gas is repeated n times, where n describes the number of cycles until sufficient layers are formed to yield a CTM film having the desired thickness. Alternatively, the deposition process may involve reversing the order of the chemicals in the cycle. For example, the starting pulse could involve introducing the transition metal chemical into the reaction space, followed by a cycle consisting of introducing into the reaction space the organometallic chemical, purging with an inert gas, introducing the transition metal chemical, and purging with an inert gas.

The growth rate of the CTM film can be calculated from the number of cycles. Although the growth rate depends on many variables, including the specific source chemicals used, typical growth rates range between about 0.03 nm and about 0.5 nm per cycle. So, for example, performing between about 50 and about 10,000 cycles produces films having a thickness ranging from about 1.5 nm to about 5.0 microns. It is noted that a single cycle may deposit less than a monolayer of the CTM film because the physical size of either chemical molecule may prevent full (100%) adsorption. Multiple cycles may be needed to form a monolayer of the CTM film.

The transition metal chemical is preferably in vapor form. Many transition metal chemicals may be used in connection with the processes of the present invention, but preferred transition metal chemicals are those that have sufficient vapor pressure at low temperature and form volatile reaction by-products, such as titanium trichloride, titanium tetrachloride, titaniumtetraiodate, zirconium tetrachloride, zirconium tetraiodate, hafnium tetrachloride, hafnium tetraiodate, niobium pentachloride, tantalum pentachloride, molybdenum pentachloride, tungsten hexachloride, and tungsten hexafluoride. Halides, including fluorides, chlorides, bromides, and iodides, are one preferred class of transition metal chemicals. Any of the transition metals in groups 3 to 12 (sometimes called groups IB to VIIIB) of the periodic table of the elements may be used in connection with the processes described herein. Preferred transition metals include metals from group 5, including titanium (Ti), zirconium (Zr), and hafnium (Hf); metals from group 6, including vanadium (V), niobium (Nb), and tantalum (Ta), and metals from group 7, including chromium (Cr), molybdenum (Mo), and tungsten (W). The following transition metals are more preferred: Ti, Zr, Hf, V, Nb, Ta, and Mo. The most preferred transition metals are Ti, Zr, Hf, and Ta.

The transition metal chemical may include a mixture of chemicals, including two or more transition metals, or molecules having two or more transition metals. Both embodiments produce a CTM film that includes more than one transition metal. The ability to tailor the film composition by controlling the composition of the transition metal chemical enables the user to finely adjust the electrical, chemical, and physical properties of the resulting CTM film. Preferably, the proportion of each transition metal chemical is equal to or greater than 1 atomic percent (atomic-%). The different transition metals may be from the same of different groups of the periodic table of the elements.

Further, two or more transition metal chemicals may be introduced one after another during a single transition metal chemical pulse. The resulting adsorbed layer preferably includes two or more transition metal chemicals, resulting in a CTM film that includes carbon and several transition metals. The ability to tailor the film composition by controlling the composition of the transition metals in the adsorbed layer enables the user to finely adjust the electrical and chemical properties of the resulting CTM film. The proportion of each transition metal chemical in the adsorbed layer is preferably equal to or greater than 1 atomic-%.

Film growth can be initiated using a transition metal chemical $T_1$ and another transition metal chemical $T_2$. In one exemplary implementation, $T_1$ and $T_2$ can be applied such that $T_1$ is added from cycles n=1 through n=x and $T_2$ is added from cycles n=x+1 through the last cycle. The transition metal chemicals $T_1$ and $T_2$ can also be applied in alternating cycles, such as when $T_1$ is applied during even-numbered cycles (n=2,4,6, . . . ) and $T_2$ is applied during odd-numbered cycles (n=1,3,5, . . . ). Transition metal halides can be introduced in alternating cycles between 1 and 10,000 times. The ratio of the cycles of different transition metal chemicals can be tailored in many different ways. One exemplary pulsing composition of the CTM film in accordance with this alternative embodiment can be characterized as, for example:

$$X*(n_1*T_1+n_2*T_2+n_3*T_3)$$

where $n_1$ is the number of subsequent cycles with transition metal chemical $T_1$; $n_2$ is the number of subsequent cycles with transition metal chemical $T_2$; $n_3$ is the number of subsequent cycles with transition metal chemical $T_3$; and X is a multiplier for the cycle sequence in the parenthesis. The resulting CTM film may include several transition metals as well as carbon and may form, for example, an essential ternary carbide in instances when two different transition metal chemicals are used, or an essentially quaternary carbide when three different transition metal chemicals are used. The ability to tailor the composition of the CTM film enables the user to finely adjust the electrical and chemical properties of the resulting thin film. The ratio of $n_1$: $n_2$ preferably ranges from between about 50:1 to about 1:50.

Various organometallic chemicals can be used in connection with the deposition processes. Preferred chemicals are those that have sufficient vapor pressure at low temperature, form volatile reaction by-products, and have at least one metal-carbon bond. In one preferred embodiment, the organometallic chemical has at least one alkyl or substituted alkyl ligand attached to the metal. The alkyl or substituted alkyl is preferably selected from the group consisting essentially of methyl, ethyl, i-butyl, butyl, i-propyl, and cyclopentadienyl. Methyl is the most preferred alkyl group. Although many metals may be used in connection with the organometallic chemical, preferred metals include aluminum, gallium, and any of the transition metals from groups 3 through 12 of the periodic table of the elements. The most preferred metal is aluminum. The metal of the transition metal chemical may be the same as the metal of the organometallic chemical. Alternatively, the organometallic chemical may contain more than one metal. Further, the organometallic chemical may contain at least one metal and at least one non-metal.

The CTM films formed using the above-described deposition processes may include more than 25 atomic-% of a single transition metal (or all transition metals in total), more than 30 atomic-% carbon, between about 0 atomic-% and about 20 atomic-% of the metal of the organometallic chemical, less than 15 atomic-% halide impurities (such as chloride), and less than 10 atomic-% total of other impurities (such as oxygen, nitrogen, or hydrogen). The CTM films may include less than 25 atomic-% of a mixture including residual metals of the organometallic chemical and impurities, and less than 15 atomic-% of a mixture including halide impurities and other impurities. The deviation from the 1:1 stoichiometric ratio of carbon to transition metal appears not to be detrimental to the quality of the CTM film. Rather, the deviation appears to enhance certain qualities of the CTM film, including stability and resistance to oxidation and preservation of conductivity at high temperature. It is preferred to have more carbon than transition metal, i.e., a carbon to transition metal ratio greater than 1, and more preferably between about 1.0 and about 1.5. This carbon to transition metal ratio improves the temperature stability of the CTM film.

While the preferred embodiments of the deposition process are described herein as involving purging with an inert gas, the terms "purging" and "purge" are intended to be construed broadly, to include not only flushing of the reaction space such as by introduction of a flow of an inert gas or other material, but also more generally to include the removal or cleansing of excess chemicals and reaction byproducts from the reaction space. For example, excess chemicals and reaction byproducts may be removed from the reaction space by pumping the reaction space and/or by lowering the pressure within the reaction space. Consistent with the broad definition of the term "purge," the removal of excess chemicals from the reaction space need not be perfectly effective, but will typically involve leaving surface bound chemicals and possibly some insignificant amount of non-surface bound chemicals or residual matter within the reaction space. Moreover, when a purge gas is used to remove chemicals from the reaction space, various inert and non-inert purge gases may be used. Preferred purge gases include nitrogen ($N_2$), helium (He), neon (Ne), argon (Ar), carbon dioxide ($CO_2$), and mixtures thereof. A constant flow of one or more of these purge gases may also be used to transport the organometallic chemical or the transition metal chemical into the reaction space and/or to adjust the pressure within the reaction space.

A dopant or contaminant may be used in conjunction with the deposition processes in a manner known to those of skill in the art. Preferred contaminants or dopants include aluminum, silicon, or germanium. The resulting CTM film would include the contaminant or dopant in an amount between a trace amount and about 20 atomic-%, and more preferably between about 1 atomic-% and about 10 atomic-%. The inclusion of a contaminant or dopant may improve the CTM film's resistance to oxidation as well as the electrical and chemical features of the film.

In a preferred embodiment, a film of titanium carbide (TiC), zirconium carbide (ZrC), tantalum carbide (TaC), or hafnium carbide (HfC) is deposited by placing the substrate inside a reactor operating at a pressure between about 0.1 mbar and about 5 mbars and a temperature between about 250° C. and about 550° C. The CTM film is generated by first introducing a transition metal chemical vapor, preferably titanium tetrachloride ($TiCl_4$), zirconium tetrachloride ($ZrCl_4$), tantalum pentachloride ($TaCl_5$), or hafnium tetrachloride ($HfCl_4$), into the reaction space in which the substrate has been placed. Following introduction of the transition metal chemical, an adsorbed layer of a portion of whichever chemical was used exists on at least one surface of the substrate. The reaction space is then purged with $N_2$ gas to remove the excess halide chemical. Next, TMA vapor is introduced into the reaction space, where it reacts with the adsorbed layer to a form a CTM film. The reaction space is then purged with an inert gas. To increase the thickness of the CTM film, this cycle may be repeated between about 1 and 5,000 times, or between 1 and 10,000 times, depending on the desired film thickness. The growth rate of the TiC, ZrC, TaC, or HfC film is between about 0.03 nm to about 0.5 nm per cycle.

Figure 3:
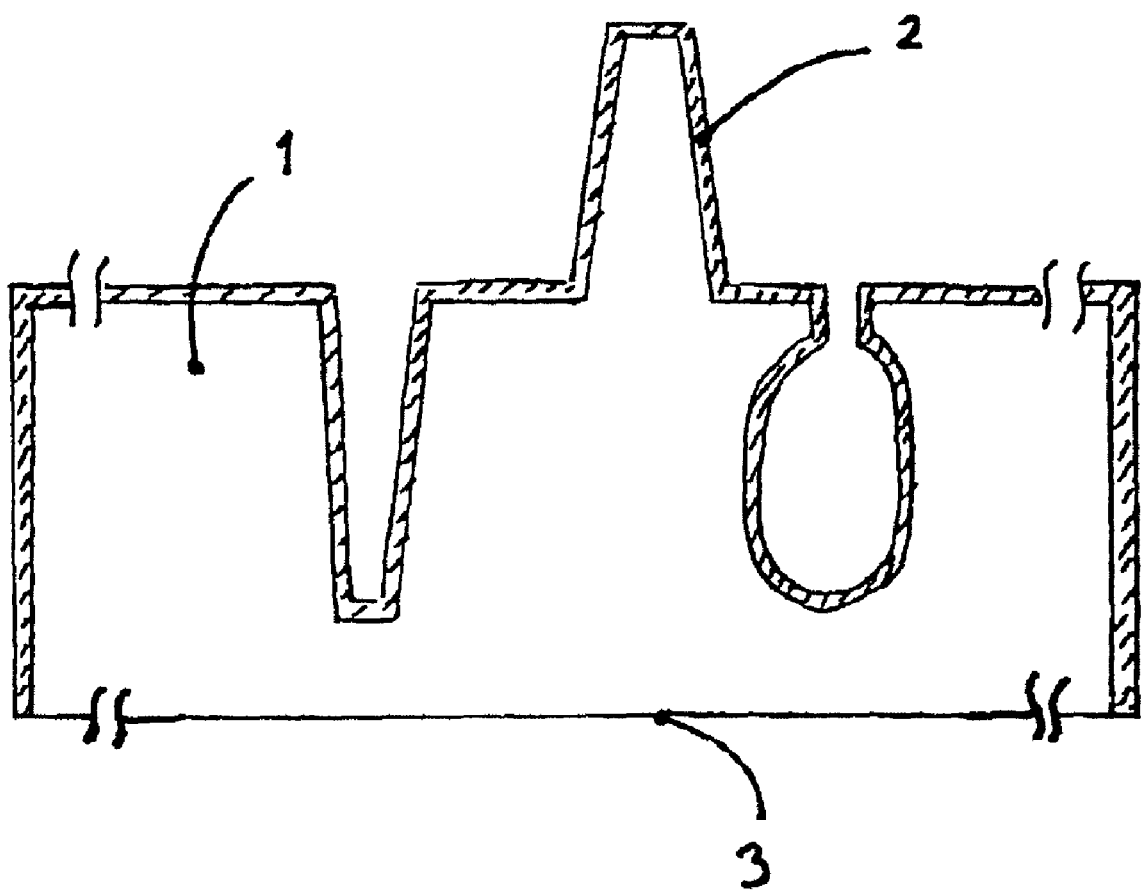
FIG. 3 shows a conformal layer of transition metal carbide film deposited onto a complex substrate topology.

Various substrates may be used in connection with the processes of the present invention. Preferred substrates include glass, silica, silicon, metals, alloys, ceramics (such as oxides, nitrides, or carbides), or mixtures thereof. Further, the substrate may be a fiber or a porous material. The substrate may be prehandled, for example, preheated or coated with a film such as one or more patterned or unpatterned dielectric, semiconductive, or conductive layers. Neither the substrate size or shape is limited by the processes described herein. FIG. 3 depicts a CTM film 2 in accordance with a preferred embodiment. CTM film 2 is grown on a substrate 1 having an irregular and complex surface topology. As shown in FIG. 3, the deposition process is equally suitable for planar substrate surfaces and substrates that have three-dimensional qualities, such as trenches, vias, or other microstructures. The CTM film may also be layered with other materials, such as, for example, oxides, nitrides, metals, and combinations or mixtures thereof. Further, the substrate may be processed with or laminated to other layers or films. For example, the CTM film may be combined with one or more layers of a metal or non-metal (e.g., platinum (Pt), ruthenium (Ru), iridium (Ir), palladium (Pd), aluminum (Al), silicon (Si), and germanium (Ge)), or with their compounds (e.g., ruthenium dioxide ($RuO_2$), ruthenium nitride (RuN), silicon dioxide ($SiO_2$), silicides, and germanium oxide ($GeO_2$)), which may be deposited over or under the CTM film using ALD processes. Such multilayer structures may include more than one layer of the CTM film and more than one layer of the other films.

Thin CTM films produced by the processes described herein can be simultaneously grown on multiple substrate surfaces or can be restricted to one substrate surface or portion thereof. With reference to FIG. 3, one or more substrate surfaces 3 or portions thereof on which film growth is not desired may be masked or otherwise shielded.

Further, several substrates may be placed in the reaction space and simultaneously coated with CTM films in a batch deposition process involving one or more of the deposition processes described herein.

Thin CTM films formed by the deposition processes display excellent thickness uniformity (nonuniformity of substantially less than 20%), and electrical conductivity uniformity (nonuniformity of the sheet resistance over 300 mm substrate length of substantially less than 20% and typically less than 5%). Although resistivity depends on the type or types of material(s) deposited, film resistance and thickness can be controlled by altering the total number of cycles. The CTM films formed by the deposition processes also exhibit hardness, wear resistance, chemical inertness, dielectric properties, catalytic properties, and high temperature durability, all of which are consistent with known carbide films.

Thin CTM films formed in accordance with the processes described herein are stable and suitable for patterning. The deposited CTM films exhibit beneficial properties understood in the art, despite possible deviation from the standard 1:1 carbon to transition metal stoichiometric ratio. Further, the CTM films can be used in applications where hardness, wear resistance, chemical inertness, conductivity, dielectric properties, catalytic properties, and/or high temperature durability are necessary. Such films may also be useful as etch stopper layers in patterning processes such as photolithography and as diffusion barrier layers in the fabrication and/or operation of various devices.

The following are several examples involving the deposition process of the preferred embodiments, including descriptions of products of the deposition process.

EXAMPLE 1A

A 195 mm×265 mm×1 mm glass substrate and a 200 mm silicon wafer substrate were loaded into the reaction space of a flow-type ALD reactor. The glass substrate was placed on top of a planar substrate holder plate such that only one of the glass substrate surfaces was exposed to the gas flow. The silicon wafer substrate was installed horizontally but supported from the edges in order to keep both sides of the wafer exposed to the gas flow. After loading the substrates into the reactor, the reaction space was pumped down and purged with $N_2$ gas (99.999% purity, AGA Oy). The $N_2$ gas flow rate was adjusted to 3 standard liters per minute (slm) in order to maintain a pressure of about 1 mbar inside the reaction space. The heated reaction space was allowed to stabilize for 5 hours, during which the reaction space and the substrates reached a targeted process temperature of about 400° C.

EXAMPLE 1B

A 195 mm×265 mm×1 mm glass substrate and a 200 mm silicon wafer substrate were loaded into the reaction space of a flow-type ALD reactor. The glass substrate was placed on top of a planar substrate holder plate such that only one of the glass substrate surfaces was exposed to the gas flow. The silicon wafer substrate was installed horizontally but supported from the edges in order to keep both surfaces of the wafer exposed to the gas flow. After loading the substrates into the reactor, the reaction space was pumped down and purged with $N_2$ gas (99.999% purity, AGA Oy). The $N_2$ gas flow rate was adjusted to 3 standard liters per minute (slm) in order to maintain a pressure of about 1 mbar inside the reaction space. The heated reaction space was allowed to stabilize for 5 hours, during which the reaction space and the substrates reached a targeted process temperature of about 500° C.

Alternating pulses of titanium tetrachloride ($TiCl_4$) (99.9% purity, Aldrich), the transition metal chemical and transition metal source, and TMA (99.9% purity, Crompton), the organometallic chemical and carbon source, were vaporized from external source vessels and introduced into each of the reaction spaces described in Examples 1 A and 1 B such that they sequentially contacted the non-protected substrate and wafer surfaces (and the walls of the reaction space). Between pulses, the reaction space was purged with $N_2$ gas. Thus the pulsing cycle was as follows: a $TiCl_4$ pulse followed by an $N_2$-purge followed by a TMA pulse followed by an $N_2$-purge. This cycle was repeated 1,499 times. The pulse lengths were as follows:

| Pulse Sources | Length of Pulse (seconds) |
|---|---|
| TiCl₄ | 1.0 |
| N₂-purge | 2.0 |
| TMA | 1.0 |
| N₂-purge | 2.0 |

After the 1,500 cycles were complete, the substrates were placed in an N₂ gas flow and cooled to a temperature of about 400° C. (this cooling step was not necessary for the substrate formed as described in Example 1A). Following removal of the heated substrates from the reaction space, the substrates were cooled to room temperature. The exposed surfaces of the substrate were completely covered with a CTM film. Similar uniform-looking CTM films were also visible on the walls of the reaction space and on the surfaces of the substrate holders. The CTM films had a metallic luster and were dark gray in color.

Electrical conductivity testing was performed, and the CTM films were found to display good conductivity. A four-point probe was used to determine sheet resistance. The measured sheet resistance of the CTM film on the glass substrate of Example 1A was about 34 ohms/square. The measured sheet resistance of the CTM film on the glass substrate of Example 1B was about 13 ohms/square. The CTM film on the silicon wafer described in Example 1B was thicker than the CTM film formed on the glass substrate described in Example 1A. These results suggest that CTM film growth rate is directly proportional to temperature. Also, these results suggest that sheet resistance is inversely proportional to film thickness.

The thin film formed on the silicon substrate was analyzed with Rutherford Backscattering Spectroscopy (RBS) to determine the elemental composition and the level of residual metals and impurities. The main elements in the CTM films formed as described in Examples 1A and 1B were titanium (about 25–35 atomic-%) and carbon (C/Ti ratio of greater than 1). The RBS results also identified aluminum as the main residual metal and chlorine as the main impurity. The Ti/Al metal ratio was about 10 for the CTM film formed as described in Example 1A and about 4 for the CTM film formed as described in Example 1B.

Elemental composition results indicated the presence of titanium and carbon in the CTM films of Examples 1A and 1B. RBS results showed only trace amounts of oxygen on the surface of the CTM film. The CTM film showed good stability against oxidation since it did not oxidize during cooling.

Without any specific optimization of the process, the thickness and sheet resistance values were relatively uniform, showing a non-uniformity of less than 20% over the exposed silicon wafer substrate area and the exposed glass substrate surface.

EXAMPLE 2

A 195 mm×265 mm×1.1 mm glass substrate, a 4 inch silicon wafer substrate, and a 10 mm carbon wafer substrate were loaded into a reaction space of a flow-type ALD reactor. The glass substrate was positioned on top of a planar substrate holder plate in order to expose only one of the glass substrate surfaces to the gas flow. The silicon wafer substrate and the carbon wafer substrate were placed on the glass substrate in order to expose only one surface of each of the wafers to gas flow. After loading the substrates into the reactor, the reaction space was pumped down and purged with N₂ gas (99.999% purity, AGA Oy). The N₂ gas flow rate was adjusted to 3 slm in order to maintain a pressure of about 1 mbar inside the reaction space. The heated reaction space was allowed to stabilize for 3 hours, during which time the reaction space and substrates reached a temperature of about 525° C.

Alternating pulses of titanium tetrachloride (TiCl₄) (99.9% purity, Aldrich), the transition metal chemical and transition metal source, and dimethylaluminum chloride (DMAC) (99% purity, Crompton), the organometallic chemical and carbon source, were vaporized from external source vessels and introduced into the reaction space such that they sequentially contacted the non-protected surfaces of the substrates (and walls of the reaction space). Between pulses, the reaction space was purged with N₂ gas. Thus the pulsing cycle was as follows: a TiCl₄ pulse followed by an N₂-purge followed by a DMAC pulse followed by an N₂-purge. This cycle was repeated 1,999 times. The pulse lengths were as follows:

| Pulse Sources | Length of Pulse (seconds) |
|---|---|
| TiCl₄ | 1.0 |
| N₂-purge | 2.0 |
| DMAC | 1.0 |
| N₂-purge | 2.0 |

After the 2,000 cycles were complete, the substrates were placed in an N₂ gas flow and cooled to a temperature of about 300° C. Then the substrates were removed from the reaction space and allowed to cool to room temperature. A CTM film was present on all substrates. The CTM film completely covered the exposed surfaces of the silicon and carbon wafers, while the non-exposed surfaces of the wafers (which had been protected during processing) had only traces of a CTM film near the edges. The CTM film completely covered the exposed surface of the glass substrate while the non-exposed surfaces had only traces of a CTM film near the edges. The CTM film had a metallic luster and was dark gray in color.

Electrical conductivity testing was performed, and the CTM film was found to display good conductivity. A four-point probe was used to determine the sheet resistance. The measured sheet resistance of the CTM film on the glass substrate was about 10 ohms/square.

The thin CTM film on the carbon wafer substrate was analyzed with RBS to determine the elemental composition and the level of residual metals and impurities. The main elements in the CTM film were titanium (about 35–40 atomic-%) and carbon (C/Ti ratio of greater than 1). RBS identified aluminum as the main residual metal and chlorine as the main impurity in the film. The Ti/Al-metal ratio was about 7, and the chlorine content was between about 1 and 3 atomic-%.

Figure 4:
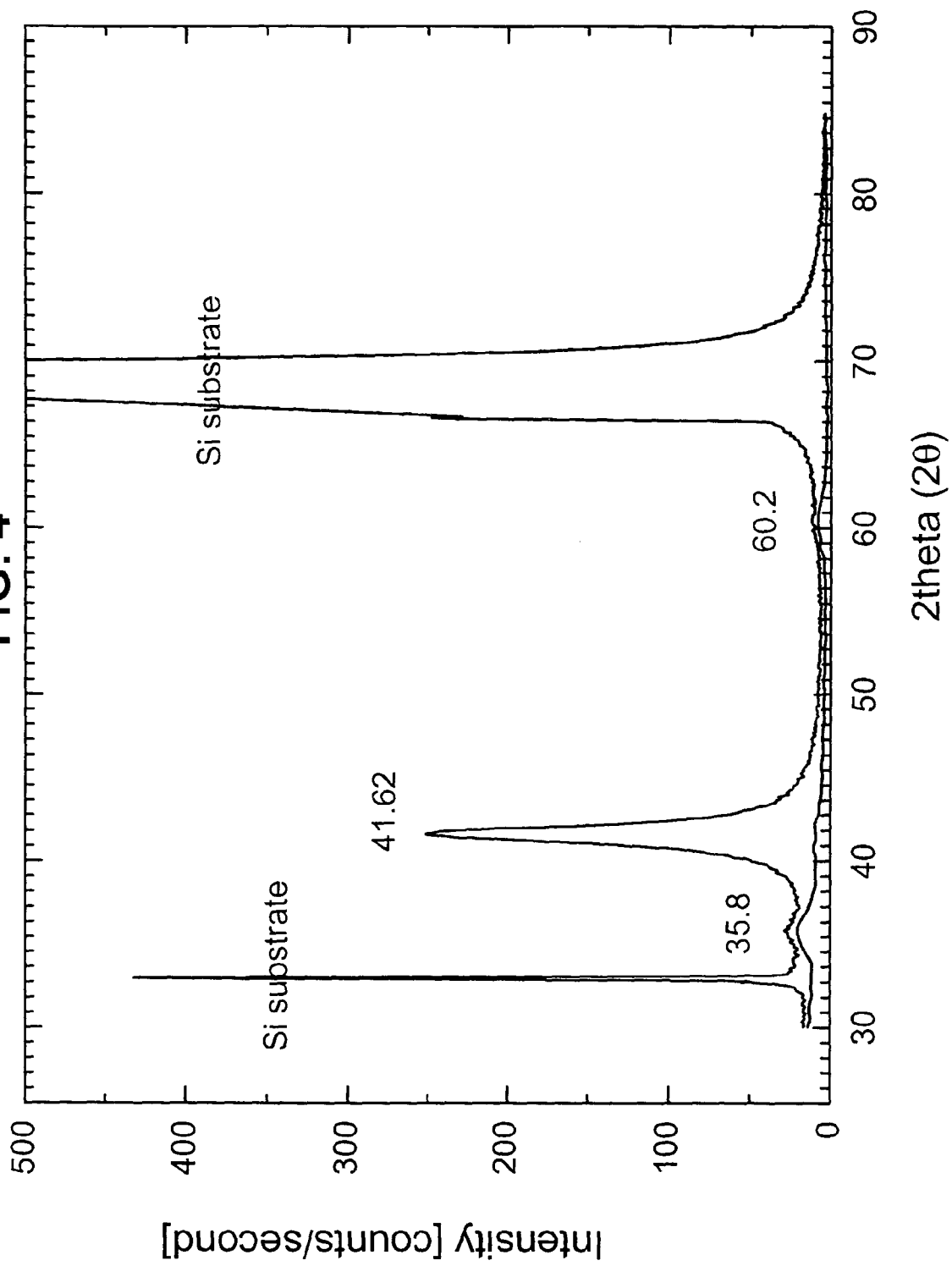
FIG. 4 shows the x-ray diffraction pattern of a carbon- and transition metal-containing thin film that was formed as described below in Example 2.

As shown in FIG. 4, XRD patterns for the CTM film on the silicon wafer substrate showed clear polycrystallinity, possibly titanium carbide peaks.

The elemental composition and XRD results indicate the presence of titanium and carbon in the CTM film. The results also suggest at least part of the CTM film is titanium carbide. The CTM film was not considerably oxidized during cooling, showing that it has good stability against oxidation.

Without specific optimization of the process, the thickness and sheet resistance values were relatively uniform, showing a non-uniformity of less than 20% over the exposed glass plate substrate area.

EXAMPLE 3

A 195 mm×265 mm×1.1 mm glass substrate and a 4 inch silicon wafer substrate were loaded into the reaction space of a flow-type ALD reactor. The glass substrate was placed on top of a planar substrate holder plate in order to expose only one of the glass substrate surfaces to the gas flow. The silicon wafer was placed on the glass substrate in order to expose only one surface of the wafer to the gas flow. After loading the substrates into the reactor, the reaction space was pumped down and purged with $N_2$ gas (99.999% purity, AGA Oy). The $N_2$ gas flow rate was adjusted to 3 slm in order to maintain a pressure of about 1 mbar inside the reaction space. The heated reaction space was allowed to stabilize for 5 hours, during which time the reaction space and the substrates reached a temperature of about 525° C.

Alternating pulses of tantalum pentachloride ($TaCl_5$) (typically 99.9% purity, Cerac), the transition metal chemical and transition metal source, and TMA (99.9% purity, Crompton), the organometallic chemical and the carbon source, were vaporized from external sources and introduced into the reaction space such that they sequentially contacted the non-protected surfaces of the substrates (and walls of the reaction space). Between pulses, the reaction space was purged with $N_2$ gas. Thus the pulsing cycle was as follows: a $TaCl_5$ pulse followed by an $N_2$-purge followed by a TMA pulse followed by an $N_2$-purge. This cycle was repeated 299 times. The pulse lengths were as follows:

| Pulse Sources | Length of Pulse (seconds) |
|---|---|
| $TaCl_5$ | 1.0 |
| $N_2$-purge | 2.0 |
| TMA | 1.0 |
| $N_2$-purge | 2.0 |

After the 300 cycles were complete, the substrates were placed in an $N_2$ gas flow and cooled to a temperature of about 300° C. The substrates were then removed from the reaction space and allowed to cool to room temperature. A thin CTM film was present on both substrates. The CTM film completely covered the exposed surface of the silicon wafer, while the non-exposed surface had only traces of a CTM film near the edges. The CTM film also completely covered the exposed surface of the glass substrate, while the non-exposed surfaces (under the wafer and the surface resting against the substrate holder plate) had only traces of a CTM film near the edges. The CTM film had a metallic luster and was dark gray in color.

Electrical conductivity testing was performed and the CTM film formed on each substrate was found to display good conductivity. A four-point probe was used to determine the sheet resistance. The measured sheet resistance of the CTM film on the glass plate was about 34 ohms/square.

A thin CTM film sample from the silicon wafer substrate was analyzed with RBS to determine the elemental composition and the level of residual metals and impurities. The main elements in the film were tantalum (about 25–30 atomic-%) and carbon (C/Ta ratio of greater than 1). RBS results indicated that aluminum is the main residual metal and chlorine is the main impurity in the film. The Ta/Al-metal ratio was about 4, and the chlorine content was between about 1 and 3 atomic-%.

XRD results from two different locations on the glass substrate showed polycrystallinity, possibly tantalum carbide peaks.

RBS results of the CTM film indicated the presence of tantalum and carbon as the main components of the CTM film, suggesting that at least part of the film is tantalum carbide. The CTM film was not considerably oxidized during cooling, indicating that it is stable against oxidation.

Without any specific optimization of the process, the thickness and sheet resistance values were relatively uniform, showing a non-uniformity of less than 20% over the exposed glass plate substrate area.

EXAMPLE 4

A 195 mm×265 mm×1.1 mm glass substrate and a 10 mm carbon wafer substrate were loaded into a reaction space of a flow-type ALD reactor. The glass substrate was lying on top of a planar substrate holder plate in order to expose only one of the glass substrate surfaces to the gas flow. The carbon wafer was placed on the glass substrate in order to expose only one surface of the wafer to the gas flow. After loading the substrates into the reactor, the reaction space was pumped down and purged with nitrogen gas ($N_2$,>99.999% purity, AGA Oy). The $N_2$ gas flow rate was adjusted to 3 slm in-order to maintain a pressure of about 1 mbar inside the reaction space. The heated reaction space was allowed to stabilize for 5 hours, during which time the reaction space and the substrates reached a targeted process temperature of about 525° C.

A CTM film containing titanium, tantalum, and carbon was prepared as a combination of two different subprocesses: a "TiC" subprocess and a "TaC" subprocess. The combined process involved alternating the TiC and TaC subprocesses according to the following formula: 15* ("TaC"+"TiC"). Each TiC subprocess was performed as described in Example 1 except that the process was conducted at a temperature of 525° C. Each TiC subprocess included 10 cycles. Each TaC subprocess was performed as described in Example 3 and included 10 cycles.

After all the 300 cycles were complete, the glass and carbon wafer substrates were placed in an $N_2$ gas flow and allowed to cool to a temperature of about 400° C. The substrates were then removed from the reaction space and allowed to cool down to room temperature. Then the resulting CTM films completely covered the exposed surfaces of substrates. Similar, uniform-looking CTM films were visible on walls of the reaction space. The CTM films had a metallic luster and were non-transparent and gray in color.

Electrical conductivity testing was performed, and the CTM films were found to display good conductivity. A four-point probe was used to determine sheet resistance. The measured sheet resistance of the CTM film on glass substrate was about 31 ohms/square.

The thin film on the silicon wafer substrate was analyzed with RBS to determine the elemental composition and level of residual metals and impurities. The main elements in the film were titanium, tantalum, and carbon. The Ti/Ta ratio was about 1, the total-titanium and tantalum composition was about 25–35 atomic-%, and the C/(Ti+Ta) ratio was greater than 1. RBS results also showed that aluminum is a main residual metal and chlorine was a main impurity in the CTM film. The (Ti+Ta)/Al-metal ratio was about 9, and the chlorine content was between about 0 and 2 atomic-%.

The elemental composition of the CTM film indicated the presence of titanium, tantalum, and carbon as main components. RBS results showed only a trace amount of oxygen on surface of the CTM film. Because the CTM films did not considerably oxidize during air cooling, the CTM films showed good stability against oxidation.

Without specific optimization of the process, the thickness and sheet resistance values were relatively uniform, showing a non-uniformity of less than 20% over the exposed glass substrate area.

EXAMPLE 5

Several other exemplary CTM films A, B, C, and D were processed by using cycles of alternating pulses of different transition metal halides, $N_2$-purge, TMA (99.9% purity, Crompton), and $N_2$-purge at various substrate temperatures on glass substrates and on 4 inch, 6 inch, 200 mm, and 300 mm silicon wafer substrates. Some of the substrates included an oxide thin film (e.g., aluminum oxide or hafnium oxide) that was prepared either in a separate process or in the same process before the formation of the CTM film:

A. 800 cycles of hafnium tetrachloride ($HfCl_4$, typically 99% purity, Cerac) and TMA at 400° C. resulted in the formation of a metallic CTM film having a sheet resistance of about 280 ohms/square.

B. 1,500 cycles of zirconium tetrachloride ($ZrCl_4$, typically 99.9% purity, Cerac) and TMA at 400° C. resulted in the formation of a metallic CTM film having a sheet resistance of about 70 ohms/square.

C. 750 cycles of niobium pentachloride ($NbCl_5$, typically 99.95% purity, Cerac) and TMA at 300° C. resulted in the formation of a metallic CTM film having a sheet resistance of about 130 ohms/square.

D. 1,500 cycles of molybdenum pentachloride ($MoCl_5$, typically 99.5% purity, Cerac) and TMA at 380° C. resulted in the formation of a metallic CTM film having a sheet resistance of about 40 ohms/square.

It will be obvious to those having skill in the art that many changes may be made to the details of the above-described embodiments and examples without departing from the underlying principles of the invention. The scope of the present invention should, therefore, be determined only by the following claims.

The invention claimed is:

1. A process for forming a carbon- and transition metal-containing film on a surface of a substrate, comprising the following process steps:
   (a) placing the substrate into a reaction space;
   (b) introducing a first chemical into the reaction space such that at least a portion of the first chemical is adsorbed onto the substrate surface;
   (c) after introducing the first chemical, purging the reaction space;
   (d) introducing a second chemical into the reaction space such that at least a portion of the second chemical reacts with the adsorbed first chemical, wherein the first chemical is one of a transition metal halide and an organometallic chemical wherein the metal portion thereof is selected from the group consisting of aluminum, gallium, and transition metal, and the second chemical is the other of said transition metal halide and said organometallic chemical wherein the metal portion thereof is selected from the group consisting of aluminum, gallium, and transition metal;
   (e) after the introducing said second chemical, purging the reaction space; and
   (f) introducing a third chemical into the reaction space, wherein further reaction takes place and the third chemical is (i) a transition metal halide when the first chemical is a transition metal halide, or (ii) an organometallic chemical wherein the metal portion thereof is selected from the group consisting of aluminum, gallium and transition metal when the first chemical is an organometallic chemical; and
   (g) after introducing the third chemical, purging the reaction space, whereby a carbon- and transition metal-containing film is formed on the substrate.

2. The process of claim 1, in which said first chemical is the transition metal halide and the second chemical is said organometallic chemical wherein the metal portion thereof is selected from the group consisting of aluminum, gallium, and transition metal.

3. The process of claim 1, in which said first chemical is said organometallic chemical wherein the metal portion thereof is selected from the group consisting of aluminum, gallium, and transition metal and the second chemical is said transition metal halide.

4. The process of claim 1, in which the carbon- and transition metal-containing film has a thickness and in which steps (d)–(g) are further carried out one or more times following step (g) to increase the thickness of the carbon- and transition metal-containing film wherein at least a portion of the third chemical reacts with the second chemical.

5. The process of claim 4, in which process steps (d)–(g) are further carried out between 1 and 10,000 times.

6. The process of claim 4, in which process steps (d)–(e) are carried out one additional time following the final step (g) wherein at least a portion of the second chemical reacts with the third chemical.

7. The process of claim 4, wherein during at least one additional sequence of process steps (d)–(g) that is carried out following step (g) said second chemical or said third chemical comprises a different transition metal halide than was introduced in at least one previously conducted step (b) or (d) and wherein at least a portion of the third chemical reacts with the second chemical.

8. The process of claim 4, wherein during at least one sequence of process steps (d)–(g) said second chemical or said third chemical comprises a different organometallic chemical than was introduced in a previously conducted step (b) or (d).

9. The process of claim 4, wherein during at least one sequence of process steps (d)–(g) said second chemical or said third chemical comprises a different transition metal halide than was introduced in a previously conducted step (b) or (d), and the second or third chemical comprises a different organometallic chemical than was introduced in a previously conducted step (b) or (d).

10. The process of claim 1, in which said transition metal halide is a chloride.

11. The process of claim 1, in which the transition metal portion of said transition metal halide is selected from the group consisting of titanium, zirconium, hafnium, vanadium, niobium, tantalum, chromium, molybdenum, and tungsten.

12. The process of claim 1, in which the transition metal halide is selected from the group consisting of titanium trichloride, titanium tetrachloride, titanium tetraiodate, zirconium tetrachloride, zirconium tetraiodate, hafnium tetrachloride, hafnium tetraiodate, niobium pentachloride, tantalum pentachloride, molybdenum pentachloride, tungsten hexachloride, and tungsten hexafluoride.

13. The process of claim 1, in which said transition metal halide includes a mixture of transition metal halides including at least two different transition metals.

14. The process of claim 13, in which each of said at least two different transition metals in the mixture of transition metal halides is present in a proportion of at least 1 atomic percent.

15. The process of claim 13, in which said transition metal halide includes at least two different transition metals that are alternately introduced into the reaction space.

16. The process of claim 1, in which the organometallic chemical wherein the metal portion thereof is selected from the group consisting of aluminum, gallium, and transition metal includes an organic portion selected from the group consisting of an alkyl group ligand and a substituted alkyl ligand.

17. The process of claim 16, in which the alkyl group ligand is selected from the group consisting of methyl, ethyl, i-butyl, butyl, i-propyl, and cyclopentadienyl.

18. The process of claim 1, in which said organometallic chemical is trimethylaluminum.

19. The process of claim 1, in which said organometallic chemical includes a halide portion.

20. The process of claim 19, in which said organometallic chemical is dimethylaluminum chloride.

21. The process of claim 1, in which the metal portions of said organometallic chemical and said transition metal halide are the same metal.

22. The process of claim 1, in which the substrate includes a previously formed film.

23. The process of claim 22, in which the previously formed film is patterned.

24. The process of claim 1, in which the substrate is placed into the reaction space such that both sides of the substrate are exposed to said first and second chemicals.

25. The process of claim 1, in which the substrate is positioned in the reaction space such that it is at least partially shielded to hinder formation of the carbon- and transition metal-containing film on at least a portion of the substrate.

26. The process of claim 1, in which more than one substrate is placed into the reaction space such that the carbon- and transition metal-containing film forms on at least one surface of each substrate.

27. The process of claim 1, in which the metal portions of said organometallic chemical and said transition metal halide are different metals.

28. The process of claim 1, in which the purging of the reaction space includes purging with an inert gas selected from the group consisting of nitrogen, helium, neon, argon, carbon dioxide, and mixtures thereof.

29. The process of claim 1, in which the substrate is selected from the group consisting of glass, silica, silicon, metals, alloys, fibers, ceramics, porous materials, mixtures thereof, and layers thereof.

30. The process of claim 1, in which the reaction space is operated at atmospheric pressure.

31. The process of claim 1, in which the reaction space is operated at a pressure that is less than atmospheric pressure.

32. The process of claim 1, in which the reaction space is operated at a pressure that is between about 0.1 mbar and about 50 mbars.

33. The process of claim 1, in which the reaction space is heated.

34. The process of claim 1, in which the reaction space is operated at a temperature that is between about 150° C. and about 600° C.

35. The process of claim 1, in which the reaction space is operated at a temperature that is between about 250° C. and about 550° C.

36. The process of claim 1, in which the reaction space is within an atomic layer deposition reactor.

37. The process of claim 1, in which the first chemical adsorbed onto the substrate surface forms a monolayer.

38. The process of claim 1, in which the first chemical adsorbed onto the substrate surface forms less than a monolayer.

39. The process of claim 1, in which the carbon- and transition metal-containing film is a transition metal carbide.

40. The process of claim 1, in which at least one of said first chemical and said second chemical is introduced into the reaction space via an inert carrier gas selected from the group consisting of nitrogen, helium, neon, argon, neon, carbon dioxide, or a mixture thereof.

41. The process of claim 1, in which at least one of said first chemical and said second chemical is in the form of a vapor.

42. The process of claim 1, in which the carbon- and transition metal-containing film includes at least 25 atomic percent of the transition metal of said transition metal halide.

43. The process of claim 1, in which the carbon- and transition metal-containing film includes between about 0 and about 20 atomic percent of the metal of said organometallic chemical.

44. The process of claim 1, in which the carbon- and transition metal-containing film includes at least 25 atomic percent of the transition metal of said transition metal halide, at least 30 atomic percent of carbon, less than 20 atomic percent of the metal portion of said organometallic chemical, and less than 10 atomic percent of an impurity.

45. The process of claim 1, in which the carbon- and transition metal containing film includes less than 25 atomic percent of a mixture including residual metals and impurities.

46. The process of claim 1, in which the carbon- and transition metal-containing film includes less than 15 atomic percent of a mixture including halides and impurities.

47. The process of claim 1, in which the carbon- and transition metal-containing film includes less than 10 atomic percent of a nitrogen-containing impurity.

48. The process of claim 1, in which the carbon- and transition metal-containing film has a nonuniformity of sheet resistance that is less than 20%.

49. The process of claim 1, in which the carbon- and transition metal containing film is deposited by an atomic layer deposition method.

50. The process of claim 1, in which the carbon- and transition metal containing film is patterned.

51. The process of claim 1, in which the transition metal halide reacts with the surface of the substrate to form a surface bound transition metal complex.

52. The process of claim 1, in which the carbon- and transition metal-containing film is selected from the group consisting of titanium carbide, zirconium carbide, hafnium carbide, niobium carbide, tantalum carbide, molybdenum carbide, and tungsten carbide.

53. The process of claim 1, in which an inert gas flows through the reaction space.

54. The process of claim 1, in which the carbon- and transition metal containing film has a film thickness non-uniformity of less than 20%.

55. The process of claim 1, further comprising depositing by atomic layer deposition a layer of a metal nitride, silicon nitride, or germanium nitride film.

56. The process of claim 1, further comprising depositing by atomic layer deposition a layer of a metal oxide, silicon oxide, or germanium oxide film.

57. The process of claim 1, further comprising depositing by atomic layer deposition a layer of a metal, silicon, or germanium film.

58. The process of claim 1, in which process steps (d)–(e) are carried out one additional time following the final step (g) wherein at least a portion of the second chemical reacts with the third chemical.

59. The process of claim 58, wherein two different transition metals are introduced in a ratio of between 50:1 and about 1:50.

60. The process of claim 58, wherein process steps (d)–(g) are carried out for a plurality of times with said different transition metal halides being introduced in alternating cycles between 1 and 10,000 times.

* * * * *